United States Patent
Holder et al.

(10) Patent No.: US 8,866,149 B2
(45) Date of Patent: Oct. 21, 2014

(54) METHOD FOR THE REUSE OF GALLIUM NITRIDE EPITAXIAL SUBSTRATES

(71) Applicant: The Regents of the University of California, Oakland, CA (US)

(72) Inventors: Casey O. Holder, Goleta, CA (US); Daniel F. Feezell, Albuquerque, NM (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/767,739

(22) Filed: Feb. 14, 2013

(65) Prior Publication Data

US 2013/0214284 A1   Aug. 22, 2013

Related U.S. Application Data

(60) Provisional application No. 61/600,301, filed on Feb. 17, 2012.

(51) Int. Cl.
| | | |
|---|---|---|
| *H01L 29/15* | (2006.01) | |
| *H01L 21/02* | (2006.01) | |
| *H01S 5/183* | (2006.01) | |
| *H01S 5/02* | (2006.01) | |
| *H01L 29/20* | (2006.01) | |
| *H01L 21/78* | (2006.01) | |
| *H01L 21/3063* | (2006.01) | |
| *H01S 5/343* | (2006.01) | |
| *H01S 5/20* | (2006.01) | |

(52) U.S. Cl.
CPC ...... *H01L 29/2003* (2013.01); *H01L 21/02389* (2013.01); *H01S 5/18341* (2013.01); *H01S 5/0217* (2013.01); *H01L 21/0254* (2013.01); *H01S 5/2009* (2013.01); *H01L 21/02658* (2013.01); *H01L 21/7813* (2013.01); *H01L 21/30635* (2013.01); *H01S 5/34333* (2013.01)
USPC .............. 257/76; 257/79; 257/80; 257/88; 257/96; 257/103

(58) Field of Classification Search
None
See application file for complete search history.

(56) References Cited

U.S. PATENT DOCUMENTS

| | | | |
|---|---|---|---|
| 6,093,952 A * | 7/2000 | Bandic et al. | 257/485 |
| 2006/0270075 A1 | 11/2006 | Leem | |
| 2009/0152565 A1 | 6/2009 | Brandes et al. | |
| 2009/0290610 A1 | 11/2009 | Eichler et al. | |
| 2010/0078672 A1 | 4/2010 | Moriyama et al. | |
| 2011/0073912 A1 | 3/2011 | Marui et al. | |
| 2011/0143467 A1 | 6/2011 | Xiong et al. | |

OTHER PUBLICATIONS

PCT International Search Report and Written Opinion dated Apr. 19, 2013 for PCT Application No. PCT/US2013/026205.

(Continued)

*Primary Examiner* — Kyoung Lee
(74) *Attorney, Agent, or Firm* — Gates & Cooper LLP

(57) ABSTRACT

A method for the reuse of gallium nitride (GaN) epitaxial substrates uses band-gap-selective photoelectrochemical (PEC) etching to remove one or more epitaxial layers from bulk or free-standing GaN substrates without damaging the substrate, allowing the substrate to be reused for further growth of additional epitaxial layers. The method facilitates a significant cost reduction in device production by permitting the reuse of expensive bulk or free-standing GaN substrates.

19 Claims, 7 Drawing Sheets

(56) References Cited

OTHER PUBLICATIONS

Dwilinski, R., et al., "Bulk ammonothermal GaN", Journal of Crystal Growth, vol. 311, No. 10, pp. 3015-3018, May 2009.
Fujito, K., et al., "Bulk GaN crystals grown by HVPE", Journal of Crystal Growth, vol. 311, No. 10, pp. 3011-3014, May 2009.
Holder, C., et. al., "Demonstration of Nonpolar GaN-Based Vertical-Cavity Surface-Emitting Lasers", Applied Physics Express, 5 (2012) 092104.
Kelchner, K. M., et al., "Nonpolar AlGaN-Cladding-Free Blue Laser Diodes with InGaN Waveguiding", Applied Physics Express, vol. 2, No. 7, pp. 071003-1 to 071003-3, 2009.
Raring, J. W., et al., "High-Efficiency Blue and True-Green-Emitting Laser Diodes Based on Non-c-Plane Oriented GaN Substrates", Applied Physics Express, vol. 3, No. 11, pp. 112101-1 to 112101-3, 2010.
Shchekin, O. B., et al., "High performance thin-film flip-chip InGaN—GaN light-emitting diodes", Applied Physics Letters, vol. 89, No. 7, pp. 071109-1 to 071109-3, 2006.
Tamboli, A. C., et al., "Photoelectrochemical Undercut Etching of m-Plane GaN for Microdisk Applications", Journal of the Electrochemical Society, vol. 156, No. 10, pp. H767-H771, 2009.
Tamboli, A. C., et al., "Smooth Top-Down Photoelectrochemical Etching of m-Plane GaN", Journal of the Elecrochemical Society, vol. 156, No. 1, (2009), pp. H47-H51.
Tyagi, A., et al., "AlGaN-Cladding Free Green Semipolar GaN Based Laser Diode with a Lasing Wavelength of 506A nm", Applied Physics Express, vol. 3, No. 1, pp. 011002-1 to 011002-3, Jan. 2010.
Xu, J. J., et al., "1-8-GHz GaN-Based Power Amplifier Using Flip-Chip Bonding," Microwave and Guided Wave Letters, IEEE, vol. 9, No. 7, pp. 277-279, Jul. 1999.

* cited by examiner

FIG. 4(f)
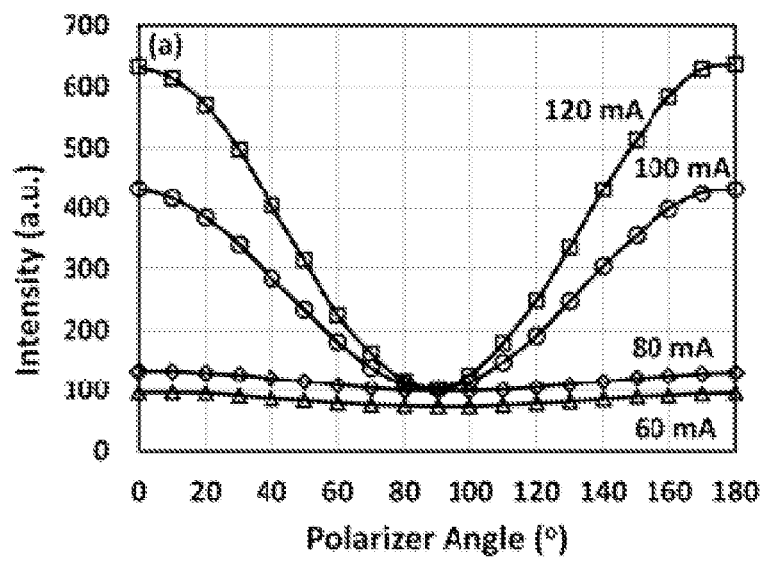
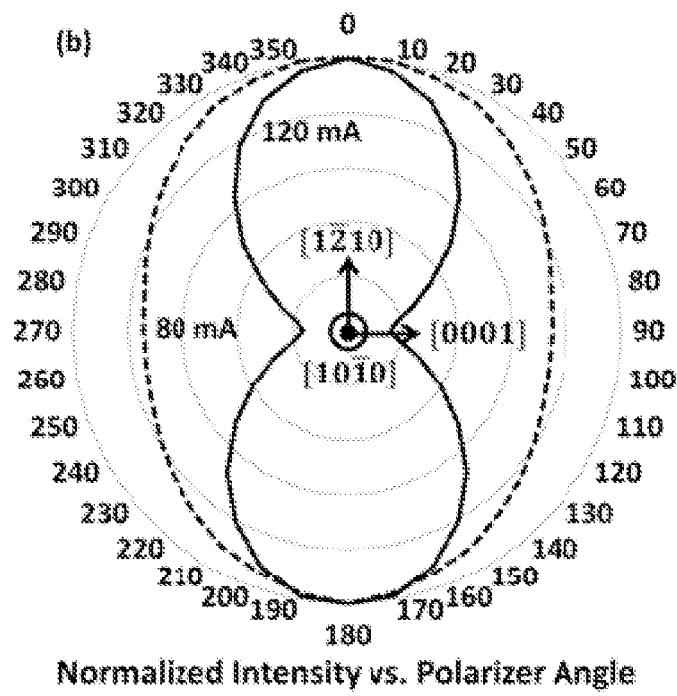
FIG. 4(g)

METHOD FOR THE REUSE OF GALLIUM NITRIDE EPITAXIAL SUBSTRATES

CROSS-REFERENCE TO RELATED APPLICATIONS

This application claims the benefit under 35 U.S.C. Section 119(e) of commonly assigned U.S. Provisional Patent Application Ser. No. 61/600,301, filed on Feb. 17, 2012 by Casey Holder, Daniel Feezell, Steven P. DenBaars, and Shuji Nakamura, entitled "METHOD FOR THE REUSE OF GALLIUM NITRIDE EPITAXIAL SUBSTRATES";

which application is incorporated by reference herein.

This application is related to:

U.S. Provisional Patent Application Ser. No. 61/673,966, filed on Jul. 20, 2012, by Casey Holder, Daniel F. Feezell, Steven P. DenBaars, and Shuji Nakamura, entitled "STRUCTURE AND METHOD FOR THE FABRICATION OF A GALLIUM NITRIDE VERTICAL CAVITY SURFACE EMITTING LASER"; and U.S. Provisional Patent Application Ser. No. 61/679,553, filed on Aug. 3, 2012, by Casey Holder, Daniel F. Feezell, Steven P. DenBaars, and Shuji Nakamura, entitled "STRUCTURE AND METHOD FOR THE FABRICATION OF A GALLIUM NITRIDE VERTICAL CAVITY SURFACE EMITTING LASER";

which applications are incorporated by reference herein.

BACKGROUND OF THE INVENTION

1. Field of the Invention

This invention relates to a method for the reuse of gallium nitride (GaN) epitaxial substrates.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Traditionally, (Al,In,Ga)N nitride devices have been grown heteroepitaxially on substrates such as sapphire and silicon carbide due to the lack of available bulk GaN substrates [1]. Non-native substrates have significant disadvantages, including lattice mismatch to GaN (which causes strain and deleterious defects such as threading dislocations) and the inability to grow high-quality GaN crystal films with orientations other than c-plane [1].

Non-c-plane orientations, including non-polar and semipolar orientations, exhibit reduced or eliminated internal electric fields in quantum well devices. This strain-induced piezoelectric polarization results in the quantum-confined Stark effect (QCSE), whereby a spatial separation between electron and hole wavefunctions reduces the recombination efficiency in light-emitting quantum wells [2]. The reduction or elimination of this field in non-polar and semi-polar crystal orientations can result in improved device performance [3], [4]. However, the lack of native bulk substrates has limited the application of these crystal orientations.

Recently, low-dislocation-density bulk GaN substrates have become commercially available [1], [5]. This has allowed for the realization of c-plane and non-c-plane devices with low threading dislocation (TD) densities [5]. It has also eliminated the lattice and thermal expansion coefficient mismatch problems that come with using non-native heteroepitaxy substrates. However, high cost has limited the adoption of bulk GaN substrates. Work continues towards bringing down the cost of bulk GaN substrates, a major barrier to widespread adoption of these preferential substrates [1], [5].

Substrate removal has previously been used in III-nitrides and other materials systems. For instance, GaN-based devices can be removed from sapphire substrates using laser liftoff. Flip-chip bonding has found application in technologies like processing of LEDs [6] and GaN power amplifiers [7]. However, it has not been feasible to remove bulk GaN substrates from homoepitaxially-grown films or devices. The ability to remove bulk GaN substrates from electronic and optoelectronic devices, without damaging the substrate itself, could allow for the reuse of these expensive substrates, substantially reducing the cost of individual devices.

SUMMARY OF THE INVENTION

The present invention discloses a device, comprising a III-nitride epitaxial film grown on a used III-nitride substrate. The epitaxial film can comprise an optoelectronic, electronic, or thermoelectric device structure. In one or more embodiments, the device structure's performance is not degraded as compared to a device structure grown on a new or non-used III-nitride substrate.

In one or more embodiments, the substrate has been used to grow at least 20 devices.

The epitaxial film can be grown on an etched surface or etched and polished surface of the substrate.

The surface of the substrate can be epitaxy ready, with no difference in crystal quality, doping, and surface roughness as compared to a new epitaxy ready substrate.

The epitaxial film can be grown on or above a sacrificial layer grown on or above the substrate.

The substrate can be a bulk or free standing III-nitride substrate, for example.

One or more embodiments of the present invention use band-gap-selective photoelectrochemical (PEC) etching to remove one or more epitaxial layers from bulk or free-standing GaN substrates without damaging the substrate, allowing the substrate to be reused for further growth of additional epitaxial layers.

The etch can be a wet etch or a band-gap-selective photoelectrochemical (PEC) etch, for example.

The etch can be performed on a sacrificial etch layer between the epitaxial layers and the substrate.

The substrate can be a polar, semipolar or nonpolar orientation of GaN.

The epitaxial layers can be sub-mounted to a carrier substrate before the etch is performed.

The substrate can be an intact and reusable substrate following the etch.

The substrate can be prepared for reuse following the etch by planarization techniques, such as etching, lapping, polishing, etc.

The substrate can be prepared for reuse following the etch by regrowth techniques, such as metalorganic chemical vapor deposition (MOCVD), molecular beam epitaxy (MBE), hydride vapor phase epitaxy (HVPE), etc.

The additional epitaxial layers can be grown on the substrate following the etch.

One or more embodiments of the technique(s) described here facilitate a significant cost reduction in device production by permitting the reuse of expensive bulk or free-standing GaN substrates.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

As noted above, substrates for the homoepitaxial growth of GaN, particularly bulk and non-c-plane substrates, are a significant portion of the cost of GaN devices, including Light Emitting Diodes (LEDs), laser diodes, transistors, and photovoltaic cells. While heteroepitaxy substrates such as sapphire can be removed using processes such as laser liftoff, no method exists for the removal and subsequent reuse of bulk or free-standing GaN substrates used for homoepitaxy of GaN. This is true for GaN substrates of polar, semipolar, and nonpolar orientations.

The present invention uses band-gap-selective photoelectrochemical (PEC) etching to nondestructively remove bulk GaN substrates without damaging the substrate. Due to the bandgap-selective nature of Photoelectrochemical (PEC) etching, it is possible to selectively etch epitaxially-grown sacrificial layers, thereby removing devices from the growth substrate without damaging the devices or the substrate [8]. Such a process leaves the entire substrate intact. With an appropriate chemical-mechanical planarization process, the removed substrate could be reused again for further epitaxial growth and processing of devices. Since the substrate itself represents a significant portion of the cost of devices grown on bulk GaN, the ability to reuse substrates multiple times could yield substantial cost reductions on a per-device basis.

The removal of a bulk GaN substrate from individual electronic and optoelectronic devices using photoelectrochemical etching of a sacrificial layer) has been demonstrated, showing this process to be feasible.

Figure 1A:
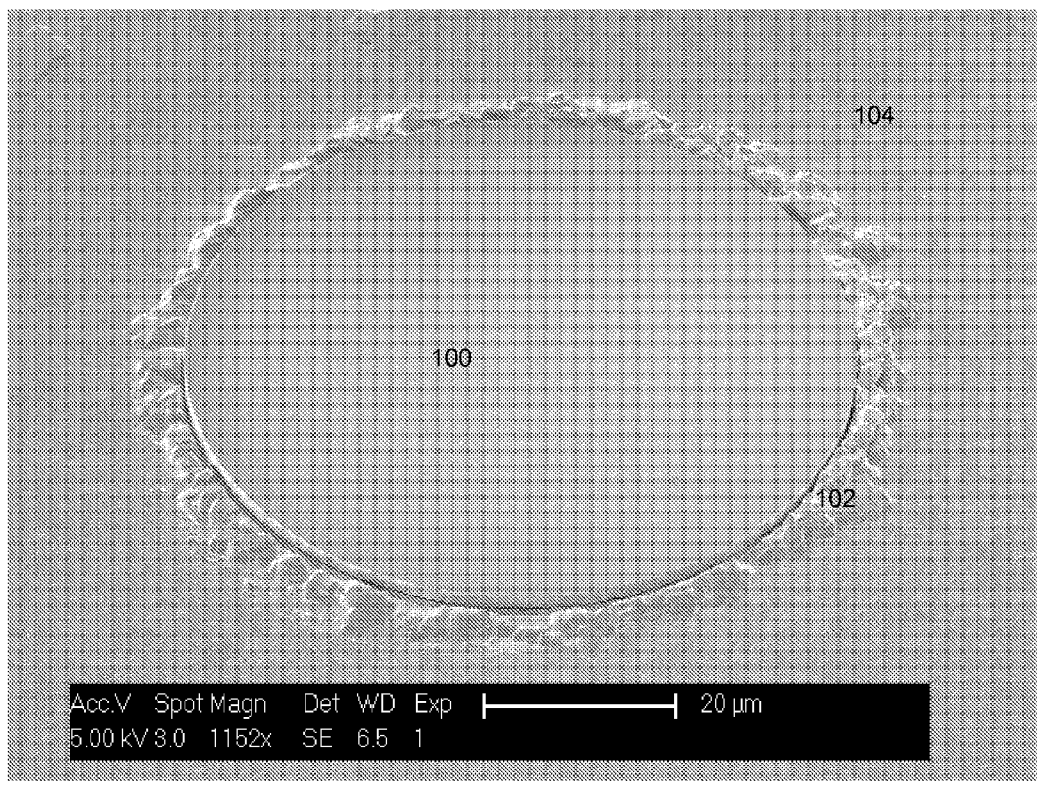
FIGS. 1A and 1B are a pair of scanning electron microscope (SEM) images showing epitaxial device layers after removal from a bulk GaN substrate, leaving the GaN substrate intact.
Figure 1B:
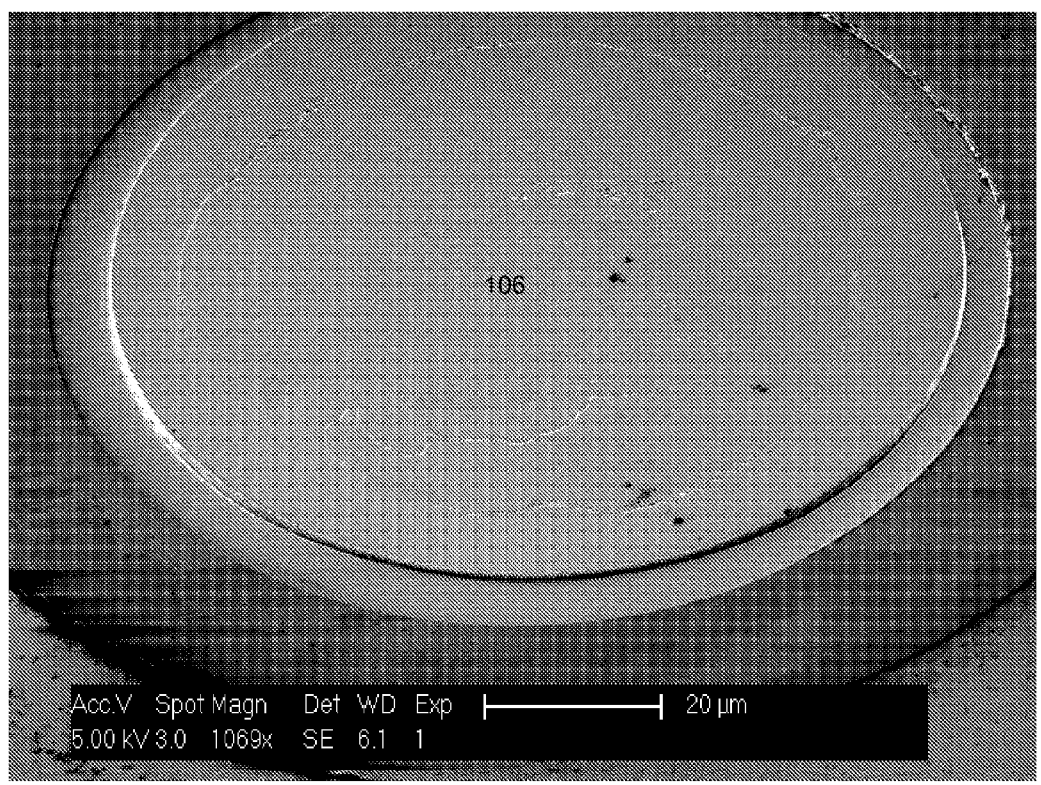

FIGS. 1A and 1B are a pair of scanning electron microscope (SEM) images showing epitaxial device layers after removal from a bulk GaN substrate, leaving the GaN substrate intact. Specifically, FIG. 1A shows epitaxially-grown layers 100 bonded 102 to a submount 104 after substrate removal using PEC etching. FIG. 1B shows a bulk GaN substrate 106, which is intact with metal contacts, after substrate removal using PEC etching.

The application of this invention to a product can follow the process flow outlined in FIGS. 2A, 2B, 2C and 2D, as one example of multiple possible applications. Specifically, FIGS. 2A, 2B, 2C and 2D together illustrate an exemplary process flow for substrate removal using PEC etching.

Figure 2A:
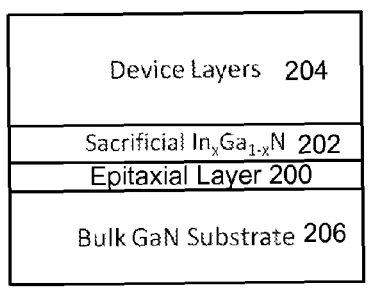
FIGS. 2A, 2B, 2C and 2D together illustrate an exemplary process flow for substrate removal using PEC etching.

FIG. 2A shows epitaxial growth of an epitaxial layer 200, a sacrificial layer 202 (e.g., $In_xGa_{1-x}N$ where $0<x\le1$), and one or more device layers 204, on a bulk GaN substrate 206.

Figure 2B:
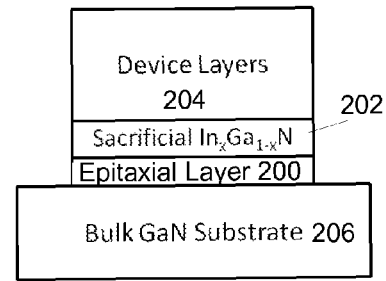
Figure 2B:

FIG. 2B shows device processing including a vertical etch to expose the sacrificial layer 202.

Figure 2D:
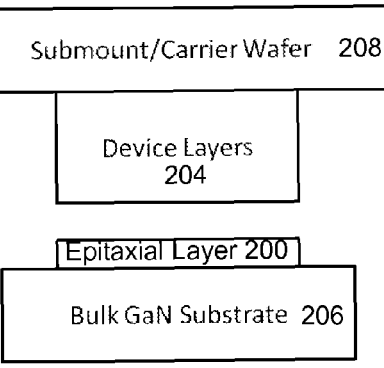
Figure 2C:
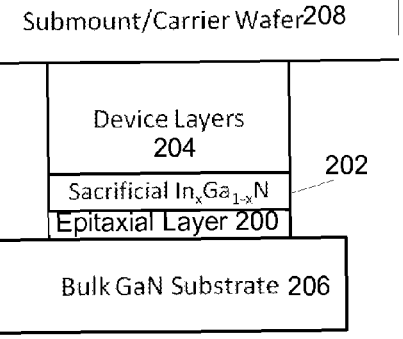

FIG. 2C shows wafer bonding the device layers 204 to carrier wafer or submount 208.

FIG. 2D shows substrate removal through PEC etching. These steps are described in more detail below.

An epitaxy-ready bulk GaN substrate, of any orientation, is produced internally or purchased from a commercial vendor. Epitaxial films including device layers 204 are grown on this substrate 206 to form electronic, optoelectronic or thermoelectric devices, such as LEDs, laser diodes, photovoltaic cells, transistors, or thermoelectric devices, as shown in FIG. 2A. Before (or after) growing any number of the device layers 204, a sacrificial $In_xGa_{1-x}N$ layer 202 is grown overlying the substrate 206. This sacrificial layer 202 could be comprised of one InGaN film of any thickness, or of multiple $In_xGa_{1-x}N$ films (such as in the form of a superlattice). This sacrificial layer 202, placed underneath the device 204, can be selectively etched, without substantial etching of the surrounding GaN (including the GaN substrate 206), higher-band-gap InGaN, or AlGaN layers through the use of band-gap-selective PEC etching.

After epitaxial growth, processing takes place according to the requirements for the desired device. Either as a part of the device fabrication or as a separate added step, a vertical dry or wet etch is performed to expose the sacrificial layer 202, as shown in FIG. 2B. Additionally, a metal contact may be made to the n-type GaN grown underneath the sacrificial layer, which may aid in the extraction of carriers and may be a separate requirement from any contacts made to the devices themselves.

The devices can then be bonded to a carrier substrate 208 using one of many possible methods for flip-chip bonding, such as Au—Au bonding or AuSn eutectic bonding, as shown in FIG. 2C. The sample can then be submerged in any appropriate electrolyte solution (including, but not limited to, KOH, HCl, $HNO_3$, etc.), and exposed to light that is above the bandgap of the $In_xGa_{1-x}N$ sacrificial layer 202, but below the bandgap of GaN. The latter condition is a requirement that allows for etching of the $In_xGa_{1-x}N$ sacrificial layer 202 while preventing undesirable etching of other surrounding layers, such as the GaN substrate 206. This light could come from any source, including narrow-emission sources like lasers or LEDs, or filtered broadband sources like a Xe lamp with a long-pass filter (using GaN itself as a filter will allow for any composition of $In_xGa_{1-x}N$ to be etched while not allowing etching of GaN). The sacrificial $In_xGa_{1-x}N$ layer 202 will etch laterally, and after some time will be completely removed (e.g., undercut), freeing the substrate 206 from the individual devices that were bonded to a carrier substrate 208, as shown in FIG. 2D. The etch process may or may not include an applied bias or temperature control, which can assist in the etch process.

After substrate removal, the devices including layers 204 (mounted on a carrier 208) can be further processed according to the desired device. The removed substrate 206 may still have metal contacts or raised mesa areas on the top surface, which are easily removed with acid etches that do not damage the substrate or other simple processing steps. There may also be previously-grown epitaxial films on the top surface. The etch process used to expose the sidewall of the sacrificial layer can also leave some features on the surface, generally very small in height (and this height can easily be controlled by controlling the depth of the top-down etch process). These epitaxial layers can then be removed by polishing, chemical-mechanical planarization (CMP), or other processes, and the surface can be treated to prepare it for further epitaxial growth. In general, the substrate may be prepared for reuse following the etch by planarization techniques, such as etching, lapping, polishing, etc., and/or by regrowth techniques, such as metalorganic chemical vapor deposition (MOCVD), molecular beam epitaxy (MBE), hydride vapor phase epitaxy (HVPE), etc.

Through this process, a bulk GaN substrate can be returned to its original, epitaxy-ready state after every use. As such, a substrate can be used multiple times, allowing for a significant cost savings with every subsequent reuse. The limit on the number of reuse events for the substrate will be determined by the portion of the substrate thickness that must be removed to prepare the substrate for reuse. At some point, the substrate may become too thin for practical reuse. The monetary amount saved with each reuse will equal the difference between a new bulk GaN substrate from a commercial vendor and the cost of additional processing required for substrate reuse. These additional processing steps (and their cost) will vary according to the devices being fabricated. For instance, an additional metal deposition and patterning step may be necessary, or this step may be incorporated into another step required for device fabrication.

Additional steps that may always be required are the polishing and surface preparation of the used substrate. Polishing and surface preparation is also required of any new substrate as well, so it is merely the degree of surface preparation required that will vary between new and reused substrates.

Process Steps

Figure 3:
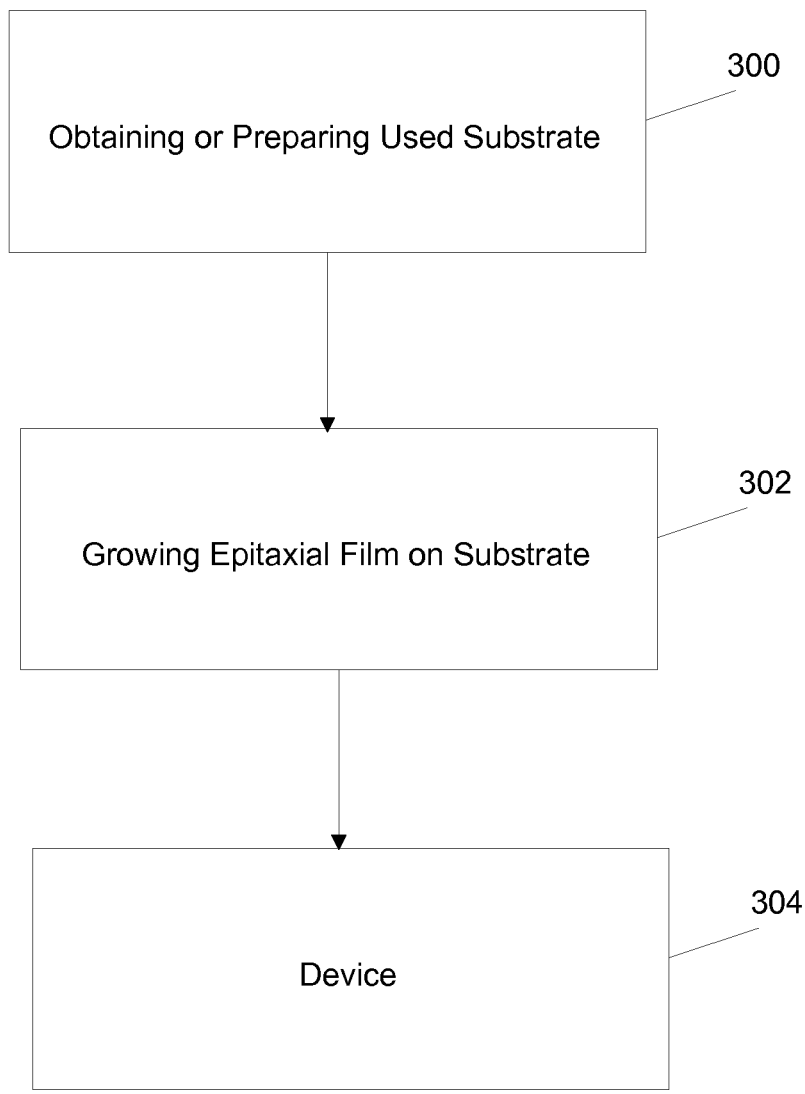
FIG. 3 illustrates a method of fabricating a device.

FIG. 3 illustrates a method of fabricating a device.

Block 300 represents obtaining or preparing a used III-nitride substrate (e.g., a GaN substrate). The step can comprise performing an etch to remove one or more epitaxial layers from a bulk or free-standing GaN or III-nitride substrate, without damaging the substrate, thereby allowing the substrate to be reused for further growth of additional epitaxial layers. The etch can be a wet etch or a band-gap-selective PEC etch, for example.

The etch can be performed on a sacrificial etch layer between the epitaxial layers and the substrate.

The substrate can be a polar, semipolar or nonpolar orientation of GaN.

The epitaxial layers can be sub-mounted to a carrier substrate before the etch is performed.

The substrate can be an intact and reusable substrate following the etch. For example, the etched surface can have a surface roughness smoother than 1 nanometer (nm) root mean square (e.g., on a 10 micrometer×10 area as measured by Atomic Force Microscopy). The roughness can be uniform over the entire wafer (e.g., 2 inch wafer).

In one or more embodiments, the surface of the used substrate after preparation is epitaxy ready, with no difference in crystal quality, doping, and surface roughness, etc., as compared to a new epitaxy ready substrate. For example, after PEC etching to remove the devices and then processing the substrate to make it epi-ready (lap/polish, CMP, chemical treatments, etc.), the reusable substrate can be the same as a new one.

However, the substrate can be further prepared for reuse following the etch by planarization techniques, such as etching, lapping, polishing, etc. The substrate can be prepared for reuse following the etch by regrowth techniques, such as metalorganic chemical vapor deposition (MOCVD), molecular beam epitaxy (MBE), hydride vapor phase epitaxy (HVPE), etc. The preparation or regrowth can include growth of additional epitaxial layer(s) 200 (see FIG. 2A-D). The additional epitaxial layers (e.g., GaN) can be grown on the substrate following the etch.

Block 302 represents growing an epitaxial film comprising a III-nitride optoelectronic or electronic device structure, on or above, or overlying, the used III-nitride substrate. The epitaxial film can be grown on an etched surface or etched and polished surface of the substrate, for example. The epitaxial film can comprise a III-nitride active region (e.g. InGaN) between a p-type III-nitride layer or region (e.g., GaN) and an n-type III-nitride (e.g., GaN) layer or region.

The epitaxial film can be grown on or above a sacrificial layer grown on or above the substrate, for example.

Block 304 represents the end result, a substrate or device or device structure (e.g., III-nitride film comprising an optoelectronic (e.g., LED, laser diode), electronic (e.g., transistor), solar cell, or thermoelectric device/device structure). The device can comprise a III-nitride epitaxial film grown on or above or overlying a used III-nitride substrate. For example, the substrate 206 in FIG. 2A can be a used substrate (in which case the device layers 202 comprise an epitaxial film grown on or above a used substrate).

In one or more embodiments, the substrate 206 can have been used to grow at least 20 devices and/or the device's performance is not degraded as compared to a device grown on a new or non-used III-nitride substrate 206.

EXAMPLE

Vertical Cavity Surface Emitting Laser (VCSEL)

Figure 4:
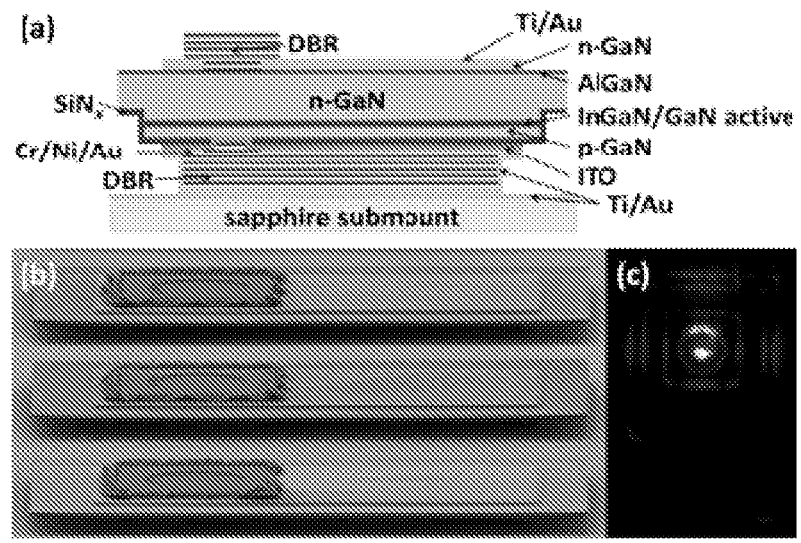
FIG. 4(a) illustrates a Vertical Cavity Surface Emitting Laser (VCSEL) device structure.
FIG. 4(b) shows a scanning electron microscope (SEM) image of three completed VCSEL devices.
FIG. 4(c) shows the near-field pattern of a 10-µm-diameter device operating above threshold.
FIG. 4(d) illustrates light vs. current (L-I) curve for a nonpolar m-plane GaN VCSEL lasing under pulsed operation at 0.03% duty cycle.
FIG. 4(e) illustrates optical emission spectrum of a nonpolar m-plane GaN VCSEL lasing under pulsed operation at 0.3% duty cycle.
FIG. 4(f)-(g) illustrate a normalized light intensity vs. polarizer angle at various currents above and below threshold for the device shown in FIG. 4(a).

FIG. 4(a) shows a schematic illustration of the VCSEL device structure. The epitaxial structure was grown on a free-standing m-plane GaN substrate (nominally offcut by 1° in the -c-direction) using atmospheric-pressure metal-organic chemical vapor deposition. The active region is aligned with a peak of the optical standing wave and consists of 5 $In_{0.10}Ga_{0.90}N$ (7 nm) quantum wells with GaN (5 nm) barriers and a 15 nm Mg-doped $Al_{0.20}Ga_{0.80}N$ electron blocking layer. An additional region of 3 $In_{0.12}Ga_{0.88}N$ (7 nm) quantum wells with GaN (5 nm) barriers was embedded in the n-GaN beneath the active region (sacrificial layer). This region was laterally undercut using band-gap-selective PEC etching after flip-chipping to separate the substrate from the devices. The placement of a 15 nm $Al_{0.30}Ga_{0.70}N$ hole-blocking layer 50 nm above the sacrificial region served to define the cavity length (7.5λ) and to prevent hole transport to the device sidewalls during the lateral undercut PEC etch [9]. A mesa was defined by etching through the active region (stopping above the sacrificial region) and a $SiN_x$ dielectric was patterned for protection of the active region sidewalls during PEC etching and to define a current aperture, which ranges in diameter from 7 to 10 μm. Approximately 50 nm (λ/4-wave) of ITO was deposited via electron cyclotron resonance sputtering (using an AFTEX-7600 ECR Plasma Deposition System by MES AFTY Corporation) and patterned as a p-type ohmic intra-cavity contact and current spreading layer. A metal ring contact was formed around the current aperture before deposition of a λ/8-wave $Ta_2O_5$ interlayer to align the high-absorption ITO with the node of the optical standing wave and a 13-period $SiO_2/Ta_2O_5$ distributed Bragg reflector (DBR). A second mesa etch was performed to expose the sidewalls of the sacrificial undercut layer and metal was patterned to form a bonding pad and to electrically connect the metal ring contact to the submount. The sample was then bonded to a gold-coated sapphire submount and the sacrificial $In_{0.12}Ga_{0.88}N$ QWs were laterally etched by bandgap-selective PEC etching, using KOH and a 405 nm laser light source, until the substrate was removed. Ohmic ring n-contacts were formed on the bonded mesas in alignment with the current apertures and a top-down bandgap-selective PEC etch was performed, with the $Al_{0.30}Ga_{0.70}N$ acting as a highly-selective stop-etch layer. Finally, a 10-period $SiO_2/Ta_2O_2$ DBR was deposited.

As indicated above, the epitaxial structure includes a lower-bandgap sacrificial region underneath the device at a well-defined location, such that the location of the $In_xGa_{1-x}N$ layer would define the length of the vertical cavity to be ideally suited for the desired VCSEL device.

This lower-bandgap material would typically be $In_xGa_{1-x}N$ of variable compositions, such that it could be selectively etched by a suitable light source, such as a filtered broadband source or a narrow-emission light source.

The Indium (In) containing layer should be preferred for the lower-bandgap sacrificial layer because it is easier to etch out the sacrificial layer by etching. This sacrificial region could be a single layer or a set of several layers, of any thickness. In addition, this selective etching is more preferred for nonpolar or semipolar VCSEL because the quantum-confined Stark effect (QCSE) limits the thickness of sacrificial layers that can be used with polar/c-plane sacrificial layers. In polar/c-plane devices, the built-in electric field that is perpendicular to the sacrificial layer separates the electrons and holes to opposite sides of the layer. Since it is holes that participate in PEC etching, this causes non-uniform etching in polar/c-plane sacrificial layers, so layer thicknesses must be kept very thin to compensate. Thus, superlattices must be used and the etching rate may suffer due to the thin sacrificial layers used: lower surface area and increased aspect ratio during lateral etching can both limit etching rate. Nonpolar and semipolar planes limit the QCSE in the sacrificial layers (remove it completely in the case of nonpolar), and thereby remove the design restrictions placed on the sacrificial layer by QCSE in the polar/c-plane devices.

Figure 4D:
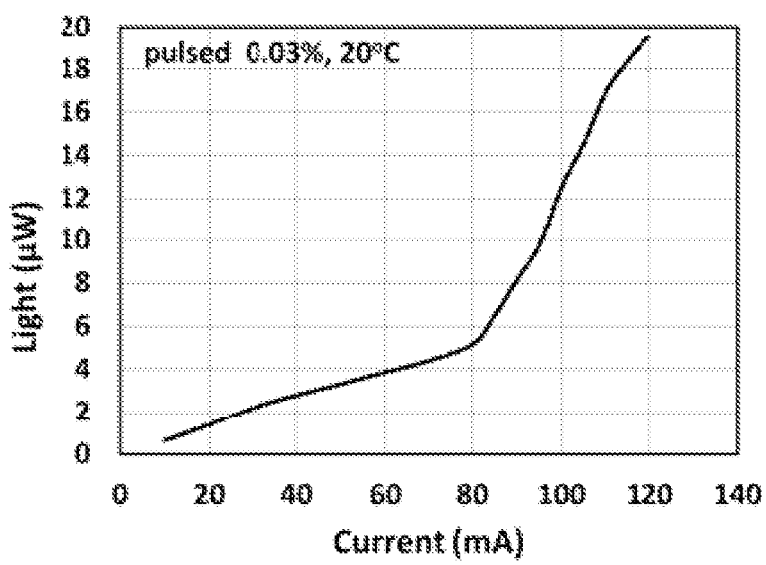
Figure 4E:
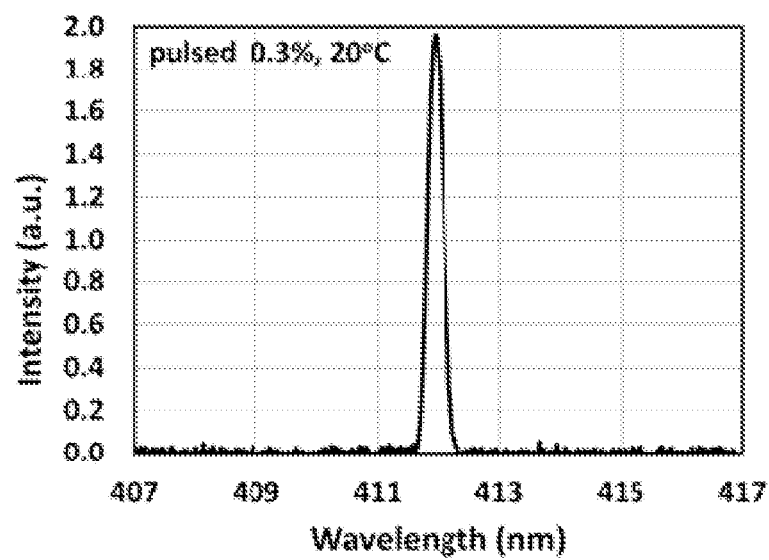

FIG. 4(b) shows a scanning electron microscope (SEM) image of three completed VCSEL devices. FIG. 4(c) shows the near-field pattern of a 10-μm-diameter VCSEL device operating above threshold. FIG. 4(d) illustrates light vs. current (L-I) curve for a nonpolar m-plane GaN VCSEL lasing under pulsed operation at 0.03% duty cycle. FIG. 4(e) illustrates optical emission spectrum of a nonpolar m-plane GaN VCSEL lasing under pulsed operation at 0.3% duty cycle. FIGS. 4(f) and (g) illustrates a normalized light intensity vs. polarizer angle at various currents above and below threshold for the device shown in FIG. 4(a).

Further information on fabrication of the VCSEL can be found in [10] and U.S. Provisional Patent Application Ser. No. 61/673,966, filed on Jul. 20, 2012, by Casey Holder, Daniel F. Feezell, Steven P. DenBaars, and Shuji Nakamura, entitled "STRUCTURE AND METHOD FOR THE FABRICATION OF A GALLIUM NITRIDE VERTICAL CAVITY SURFACE EMITTING LASER", which application is incorporated by reference herein.

Benefits and Advantages

Bulk or free-standing GaN substrates (including polar, semipolar, and nonpolar orientations) offer significant performance advantages for electronic and optoelectronic devices over conventional heteroepitaxy substrates, such as sapphire or silicon carbide, due to the resulting reduction in threading dislocation densities. However, bulk GaN substrates represent a significant cost increase over conventional heteroepitaxy substrates. This invention will allow for the reuse of bulk GaN substrates, thereby reducing the per-device cost of optoelectronic or electronic devices grown on bulk or free-standing GaN substrates.

One or more embodiments of the invention obtain high-performance electronic and optoelectronic devices produced at a lower cost through the reuse of bulk or free-standing GaN substrates, with no degradation of the device performance caused by the reuse of the substrate.

For example, one or more embodiments of the invention can be used to significantly reduce the cost of flip-chip bonded electronic, optoelectronic or thermoelectric devices (such as LEDs, laser diodes, photovoltaic cells, transistors, and Photoelectrochemical (PEC) cells for gas generation) grown homoepitaxially on reusable bulk or free-standing GaN substrates. This cost savings would be realized through the option of reusing expensive bulk or free-standing GaN substrates of any orientation (c-plane, non-polar, or semipolar).

Free-standing bulk GaN substrates used for the growth and fabrication of a variety of optoelectronic or electronic devices can be removed and reused for future growths of similar devices with no degradation in the quality of the substrates or the devices grown on them.

Possible Modifications

The present invention has experimentally demonstrated the bonding of individual (In,Al,Ga)N devices to a submount, and has demonstrated the removal of a free-standing GaN epitaxial substrate through band-gap-selective (PEC) etching of a sacrificial layer. However, other methods of removing or etching the substrate are possible.

The present invention has demonstrated the reuse of a bulk GaN substrate (after bonding and removal of individual devices) for subsequent epitaxial growth, as well as device production. However, other reuse of other substrates or other III-nitride substrates is also included.

Nomenclature

The terms "(AlInGaN)" "(In,Al)GaN", or "GaN" as used herein (as well as the terms "III-nitride," "Group-III nitride", or "nitride," used generally) refer to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$. These terms are intended to be broadly construed to include respective nitrides of the single species, Ga, Al, In and B, as well as binary, ternary and quaternary compositions of such Group III metal species. Accordingly, it will be appreciated that the discussion of the invention hereinafter in reference to GaN and InGaN materials is applicable to the formation of various other (Ga,Al,In,B)N material species. Further, (Ga,Al,In,B)N materials within the scope of the invention may further include minor quantities of dopants and/or other impurity or inclusional materials.

One approach to decreasing polarization effects in III-nitride devices is to grow the devices on a nonpolar substrate or nonpolar planes of the crystal. These include the {11-20} planes, known collectively as a-planes, and the {10-10} planes, known collectively as m-planes. Such planes contain equal numbers of gallium and nitrogen atoms per plane and are charge-neutral. Subsequent nonpolar layers are equivalent to one another, so the bulk crystal will not be polarized along the growth direction.

Another approach to reducing polarization effects in III-nitride devices is to grow the devices on a semipolar substrate or semipolar planes of the crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the bulk crystal will have reduced polarization along the growth direction.

REFERENCES

The following references are incorporated by reference herein:
[1] R. Dwiliński et al., "Bulk ammonothermal GaN," Journal of Crystal Growth, vol. 311, no. 10, pp. 3015-3018, May 2009.
[2] K. M. Kelchner et al., "Nonpolar AlGaN-Cladding-Free Blue Laser Diodes with InGaN Waveguiding," Applied Physics Express, vol. 2, no. 7, p. -, 2009.
[3] A. Tyagi et al., "AlGaN-Cladding Free Green Semipolar GaN Based Laser Diode with a Lasing Wavelength of 506.4 nm," Applied Physics Express, vol. 3, no. 1, p. 011002, January 2010.
[4] J. W. Raring et al., "High-Efficiency Blue and True-Green-Emitting Laser Diodes Based on Non-c-Plane Oriented GaN Substrates," Applied Physics Express, vol. 3, no. 11, pp. 112101-112101, 2010.
[5] K. Fujito, S. Kubo, H. Nagaoka, T. Mochizuki, H. Namita, and S. Nagao, "Bulk GaN crystals grown by HVPE," Journal of Crystal Growth, vol. 311, no. 10, pp. 3011-3014, May 2009.
[6] O. B. Shchekin et al., "High performance thin-film flip-chip InGaN—GaN light-emitting diodes," Applied Physics Letters, vol. 89, no. 7, p. 071109, 2006.
[7] J. J. Xu et al., "1-8-GHz GaN-based power amplifier using flip-chip bonding," Microwave and Guided Wave Letters, IEEE, vol. 9, no. 7, pp. 277-279, 1999.
[8] A. C. Tamboli, M. C. Schmidt, A. Hirai, S. P. DenBaars, and E. L. Hu, "Photoelectrochemical Undercut Etching of m-Plane GaN for Microdisk Applications," Journal of The Electrochemical Society, vol. 156, no. 10, p. H767, 2009.
[9] A. Tamboli, M. Schmidt, S. Rajan, U. Mishra, S. DenBaars, and E. Hu: J. Elecrochem. Soc. 156 (2009) H47.
[10] C. Holder et. al., "Demonstration of Nonpolar GaN-based Vertical Cavity Surface Emitting Lasers," Appl. Phys. Express 5 (2012) 092104.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A device, comprising:
a III-nitride epitaxial film grown on or above a used III-nitride substrate, wherein the epitaxial film comprises an optoelectronic, electronic, or thermoelectric device structure and the device structure's performance is not degraded as compared to a device structure grown on a new or non-used III-nitride substrate.
2. The device of claim 1, wherein the epitaxial film is grown on an etched or etched and polished surface of the substrate.
3. The device of claim 2, wherein the surface is epitaxy ready, with no difference in crystal quality, doping, and surface roughness as compared to a new epitaxy ready substrate.
4. The device of claim 1, wherein the substrate is a bulk or free standing III-nitride substrate.
5. The device of claim 4, wherein the substrate is Gallium Nitride.
6. A device, comprising:
a III-nitride epitaxial film grown on or above a used III-nitride substrate, wherein the substrate has been used to grow at least 20 devices.
7. A device, comprising:
a III-nitride epitaxial film grown on or above a used III-nitride substrate, wherein the epitaxial film is grown on or above a sacrificial layer grown on or above the substrate.
8. A method of fabricating a device, comprising:
growing an epitaxial film, comprising a III-nitride optoelectronic or electronic device structure, on or above a used III-nitride substrate, wherein the epitaxial film comprises an optoelectronic, electronic, or thermoelectric device structure and the device structure's performance is not degraded as compared to a device structure grown on a new or non-used III-nitride substrate.
9. A method for reusing gallium nitride (GaN) substrates, comprising:
performing an etch to remove one or more epitaxial layers from a bulk or free-standing GaN substrate without damaging the substrate, thereby allowing the substrate to be reused for further growth of additional epitaxial layers.
10. The method of claim 9, wherein the etch is a wet etch.
11. The method of claim 10, wherein the etch is a band-gap-selective photoelectrochemical (PEC) etch.
12. The method of claim 9, wherein the etch is performed on a sacrificial etch layer between the epitaxial layers and the substrate.
13. The method of claim 9, wherein the substrate is a polar, semipolar or nonpolar orientation of GaN.
14. The method of claim 9, wherein the epitaxial layers are sub-mounted to a carrier substrate before the etch is performed.
15. The method of claim 9, wherein the substrate is an intact and reusable substrate following the etch.
16. The method of claim 15, wherein the substrate is prepared for reuse following the etch by planarization techniques, such as etching, lapping, polishing.
17. The method of claim 15, wherein the substrate is prepared for reuse following the etch by regrowth techniques including metalorganic chemical vapor deposition (MOCVD), molecular beam epitaxy (MBE) or hydride vapor phase epitaxy (HVPE).
18. The method of claim 15, wherein the additional epitaxial layers are grown on the substrate following the etch.
19. A device or substrate processed using the method of claim 9.

* * * * *